United States Patent [19]
Zuleeg

[11] 4,452,646
[45] Jun. 5, 1984

[54] METHOD OF MAKING PLANAR III-V COMPOUND DEVICE BY ION IMPLANTATION

[75] Inventor: Rainer R. Zuleeg, San Juan Capistrano, Calif.

[73] Assignee: McDonnell Douglas Corporation, Long Beach, Calif.

[21] Appl. No.: 464,604

[22] Filed: Feb. 7, 1983

Related U.S. Application Data

[60] Continuation of Ser. No. 306,509, Sep. 28, 1981, abandoned, which is a division of Ser. No. 973,743, Dec. 26, 1978, abandoned.

[51] Int. Cl.³ .................... H01L 21/263; H01L 21/26
[52] U.S. Cl. ...................................... 148/1.5; 29/571; 29/576 B; 148/187; 357/61; 357/91
[58] Field of Search ............... 148/1.5, 187; 29/576 B, 29/571; 357/61, 91, 22

[56] References Cited
U.S. PATENT DOCUMENTS

| | | | |
|---|---|---|---|
| 4,038,563 | 7/1977 | Zuleeg et al. | 307/205 |
| 4,108,686 | 8/1978 | Jacobus, Jr. | 148/1.5 |
| 4,314,858 | 2/1982 | Tomasetta et al. | 148/1.5 |
| 4,372,032 | 2/1983 | Collins et al. | 29/571 |

*Primary Examiner*—Upendra Roy
*Attorney, Agent, or Firm*—Gregory A. Cone; George W. Finch; Donald L. Royer

[57] ABSTRACT

A planar process and new structure which leads to large scale integration capability by utilizing selective ion implantation into semi-insulating Gallium Arsenide substrates or any other compound semi-conducting material to yield isolated depletion enhancement mode JFETS and MESFETS, p-n junction and Schottky diodes, resistors and hot electron current limiters. The planar structure provides relatively simple integrated circuit fabrication which results in an increase of circuit device reliability and thereby improves not only the ease of fabrication but thereby increases yield of enhancement mode JFETS and MESFETS and other like devices in integrated circuit fabrication. In addition improved device structure is possible which increases device speed.

6 Claims, 16 Drawing Figures

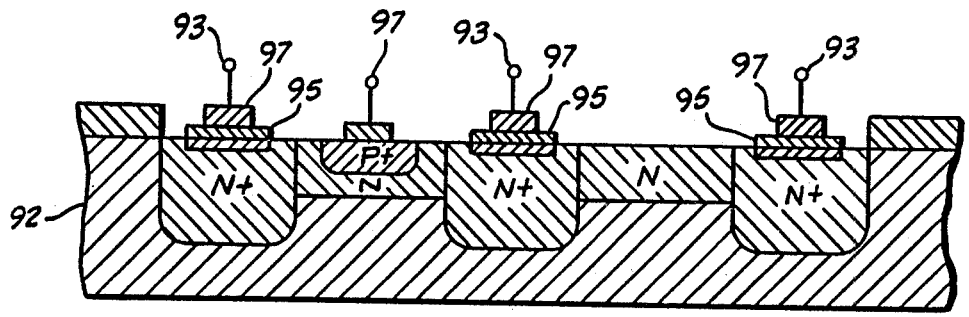
FIG.—5E
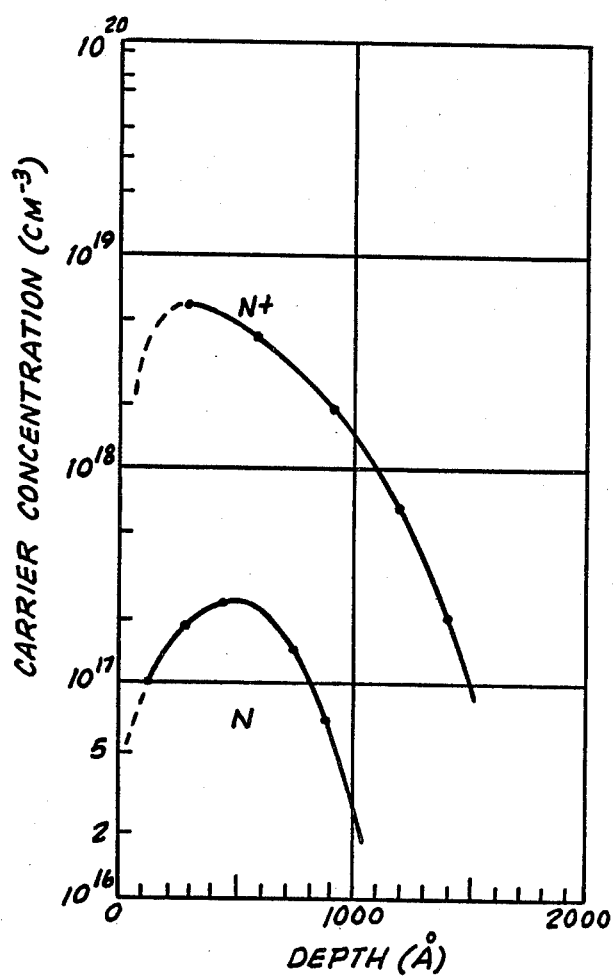
FIG.—6

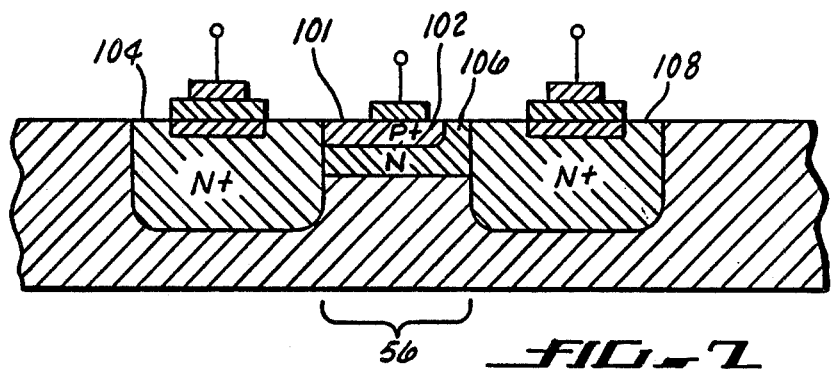
FIG_7
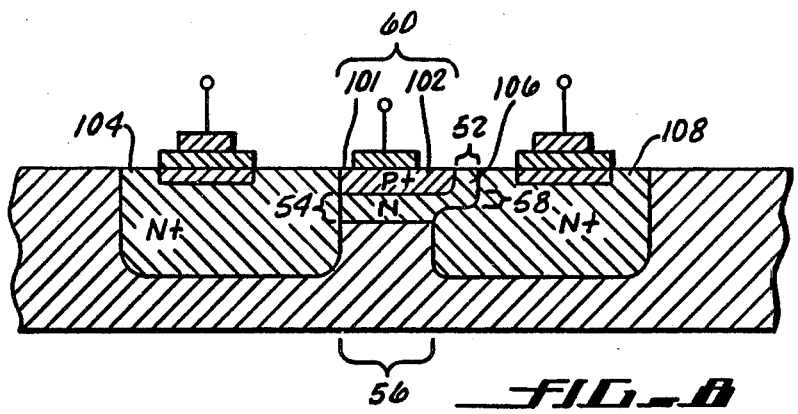
FIG_8
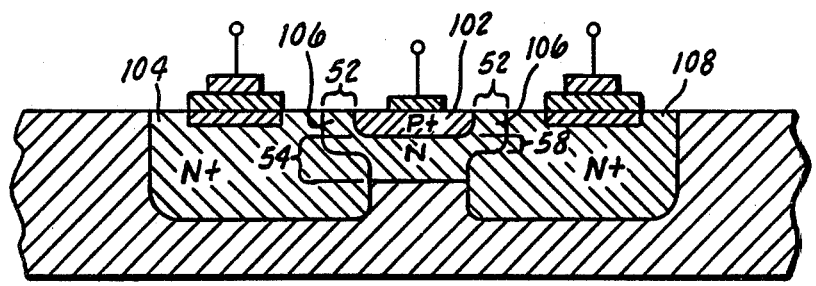
FIG_9

METHOD OF MAKING PLANAR III-V COMPOUND DEVICE BY ION IMPLANTATION

This is a continuation of U.S. Ser. No. 306,509 filed Sept. 28, 1981, now abandoned, which in turn was a Divisional Application based on U.S. Ser. No. 973,743, filed Dec. 26, 1978, also now abandoned.

BACKGROUND OF THE INVENTION

1. Field of the Invention

The field of this invention relates to a planar process and structure for use in MSI and LSI structures, and more particularly relates to Gallium Arsenide integrated circuit fabrication using a planar technology in conjunction with selective ion implantation. In addition a new structure is described which improves the JFET and MESFET device speed.

In silicon integrated circuit fabrication the planar process has led to medium scale and large scale fabrication technology used extensively in modern electronics. For Gallium Arsenide integrated circuit fabrication, however, a planar technology was not readily available although even before Germanium and Silicon became important, compound semiconductors were the object of much interest, particularly in the so called three-five compounds of which Gallium Arsenide has proven to be the most important. Gallium Arsenide is a material whose characteristics are closely related to those of Germanium since Gallium is a third column neighbor and Arsenic is the fifth column neighbor of Germanium in the periodic table thus acquiring the label III-V compound. Gallium Arsenide possesses a direct type of band structure and has high electron mobility and a large band gap, and is superior to silicon in many respects. The high vapor pressure of arsenic makes production of Gallium Arsenide, at least at the electronic grade, extremely difficult. Czochralski techniques using high pressure chambers have been unsatisfactory. Horizontal furnaces using zone refining techniques have proven to be more satisfactory with the resulting material still not totally acceptable due to inferior structural perfection. Use of compound materials particularly in the area of fabrication of switching parametric diodes and hot electron or "Gunn" effect current limiters is for the same reason difficult and unreliable. It is clear then that the advantages of a planar structure and process lie in the ease of integrated circuit fabrication with regard to Gallium Arsenide substrates and would result in increased device and circuit reliability when creating isolated depletion and enhancement mode JFETS and MESFETS, unijunction and Schottky barrier diodes, resistors and hot electron current limiters. Further, the elimination of stepheights which of necessity must be traversed by metal connections and diffusions through the planar process has been an advantage aptly demonstrated by silicon as well as other single element integrated circuit fabrication technology. Due to the problems heretofore pointed out with regard to III-V compounds and in particular Gallium Arsenide, deposition of photoresist and development as well as deposition of insulating layers such as silicon dioxide and silicon nitride have been difficult to control in optimum processing environments.

2. Prior Art

In silicon integrated circuit fabrication technology the planar process has led to medium scale (MSI) and large scale integration (LSI) now extensively used in modern electronics. However, Gallium Arsenide integrated circuit fabrication has been limited to the etched mesa structure due to the different processing steps required and planar technology has not been applied to semi-insulating GaAs substrates. The GaAs techniques in the prior art required fabrication using a mesa structure which was etched out, leaving stepheights to be traversed by metal interconnections and diffusions, thereby subjecting such traversing layers to stress and possible fracture as well and providing a region for the collection of processing debris. The foregoing problems have resulted in lower yields as well as a decrease in device and circuit reliability avoided by the instant invention.

In addition to the foregoing prior processing techniques limited the size of the particular structure involved thereby restricting the minimum dimensions thereof to that obtainable through optical means and essentially fixed the speed of such devices at a particular limit.

SUMMARY OF THE INVENTION

The processes and structures herein disclosed are of a planar type structure created through the use of selective ion implantation which improves the fabrication and yield of enhancement mode of FETS and MESFETS and other devices in medium scale (MSI) and large scale integration (LSI) applications.

The prior art fabrication processes briefly described above are essentially the epitaxial and diffusion processes reassessed below:

The Gallium Arsenide Epitaxial Reactor process is based on the design as described by Effer and other workers. Reactors operate in a furnace having three zone temperature control. The furnace is kept at an operating temperature continuously to minimize recycle time. The system is, usually, completely automated and boat loaders are used to move the substrate and the source to the proper temperature. The process sequence is controlled by clock-timers and relays, and teflon solenoid valves are used to control the gas flow. Mass flow controllers are used in both the hydrogen diffusion line and the line to the arsenic trichloride bubbler. The automatic epitaxy reactor leads to reproducible results from run to run and uses a solid source method for growing epitaxial GaAs films for circuit fabrication.

This method uses elemental Gallium saturated with arsenic. The transport in this system is from a thin coat of Gallium Arsenide which forms on the Gallium when properly saturated with arsenic. Control is, however, difficult in that the source must be kept well saturated in order to prevent the formation of excess Gallium in the gas stream, and dissolution of Gallium Arsenide into Gallium can occur when heated in hydrogen. In addition the reaction between elemental Gallium and the quartz boat used to contain it leads to the formation of a source of silicon, a major contaminant in Gallium Arsenide film.

The diffusion process presently used in Gallium Arsenide device fabrication is difficult to control so as to ensure reproducible characteristics from run to run. Unlike single elemental diffusion the quality of the vacuum and control of the arsenic vapor pressure are critical factors in controlling the junction depth and surface quality, and often quality is dependent on lateral surface alignment. Diffusion is inherently accompanied by lateral spreading and therefore limits the minimal device dimension achievable by diffusion, even if proper alignment is achieved.

If, however, ion implantation is used lateral junction definition can be maintained and minimal dimension fabrication is achievable.

Voltage and current limiting functions are essential to the specific operation of many electronic circuits. The circuit designer has at his disposal very good two terminal voltage limiters such as Zener Diodes and Forward Bias p-n junctions. However, for current limiting one usually uses the simple, but inferior, resistor, or one resorts to a three terminal transistor. The third terminal, which requires an additional bias supply is decidedly disadvantageous for integrated circuit fabrication primarily because of the additional connection requirements. Two terminal current limiting circuits can be synthesized with transistors and resistors but added junction voltage drops and low speed of operation limit the usefulness of the foregoing devices. The diffused junction field affect transistor with a gate tied to a source terminal has been the best available two terminal current limiter to date. However, for applications in integrated logic circuits it is extremely difficult to manufacture these devices with a precise limiting current as pointed out heretofore.

A process is herein described which allows the fabrication of Gallium Arsenide devices or more accurately the fabrication of electrical devices on a Gallium Arsenide substrate by a planar process as opposed to a mes structure which uses multiple ion implantation at various energy levels which creates a timed controlled conduction depth for fabricating reproducible dopant profiles over the source and drain regions not only for current limiters and the like but also for enhancement mode JFETS, MESFETS, p-n junction, Schottky diodes, and other like devices. This fabrication technique converts previous lateral alignment problems lateral of the surface of such compound semiconductive devices to timed controlled vertical alignment thereby avoiding the lateral definition problems inherent in prior art as well as avoidance of stepheights in mesa type structures thereby minimizing stress on contacts, fracture regions, and processing debris collection areas. Input output regions for current limiting devices and source and drain regions for JFET devices are fabricated using a triple ion implantation by varying concentration and doses inversely prior to channel fabrication. The channel is fabricated using a relatively low ion concentration as compared to the input output or source and drain regions and in all cases holding the substrate temperature at a constant value. The ion implants are then annealed at a relatively high temperature and in the case of the enhancement mode JFET a p+ gate layer is prepared by Zn diffusion or further timed implant. In the diffusion process an open tube zinc (Zn) diffusion process is used to form the gate region of Gallium Arsenide JFET circuits. The open tube process enables many diffusions to be carried out in rapid succession, thus avoiding the problem associated with encapsulating under vacuum. In any case, the depth of the p+ gate layer is such that sufficient implanted impurity dose is left active in the channel for the desired device operation. This planar structure allows the fabrication of an improved Gallium Arsenide enhancement mode FET structure (EFET), over the standard geometry in that the series resistance between the source and the gate region which is responsible for the degraded performance in such devices is reduced to the optimum source drain saturation current. The elimination of this series resistance is obtained by reducing the source gate spacing to essentially zero by shifting the gate towards the source and thereby forming a p+/n+ junction and obtaining structures of very small values of the series resistance between the two contacts. In the usual case such a new structure would increase yield losses due to the shorting of the p+ region to the metallic portion of the ohmic source contact arrangement. This can be obviated by recessing the metal contact of the source in the proposed structure from the resultant p+/n+ junction to avoid the metal to p+ shorts and makes mask alignment easier.

In addition the implantation process allows a high speed switching geometry for the enhancement JFET which removes lateral control difficulties for small spacing in the micron range by photo or electron beam photography to a vertical control of the submicron separation between the p+ gate and the n+ drain regions. Such a structure exhibits the shortest transit time of carriers in the channel and therefore offers the ultimate switching speed capability. A modified structure allows enchancement and depletion mode operation by providing a channel region less than or equal to one micrometer and the structure retains the vertical submicron dimension control by ion implantation and achieves the ultimate switching speed performances and the mode of operation can be controlled by the bias applied to the gate. It is therefore an object of this invention to provide an ion implantation process which allows vertical control, of fabrication dimensions of compound semiconductor materials.

BRIEF DESCRIPTION OF THE DRAWINGS

FIG. 5a through 5e is a cross-sectional view of the combined planar E-JFET and limiter at selected steps of the process of fabrication.

FIG. 6 is a graph of the dopant profiles of the ion implanted source drain and channel regions.

FIG. 7 is a cross-sectional view of the planar minimal series resistance enhancement mode JFET.

FIG. 8 is a cross-sectional view of the minimum channel asymetric enhancement mode JFET.

FIG. 9 is a cross-sectional view of the minimum channel symetric enhancement mode JFET.

DESCRIPTION OF THE SPECIFIC EMBODIMENT

More specifically the invention herein described may be discussed by the following theory in reference to the drawings described above.

Theory of Operation

Figure 1A:
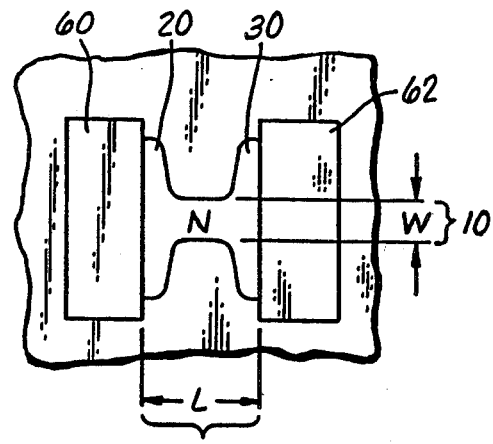
FIG. 1a is a top view of a GaAs current limiter.
Figure 1B:
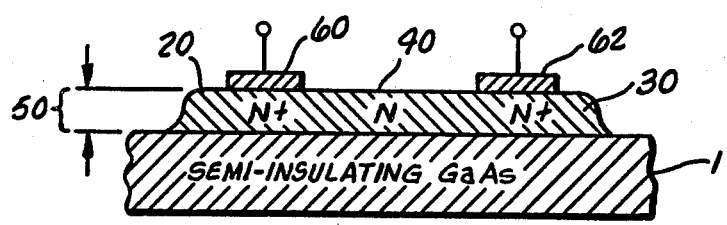
FIG. 1b is a cross-sectional view of a mesa GaAs current limiter.
Figure 2:
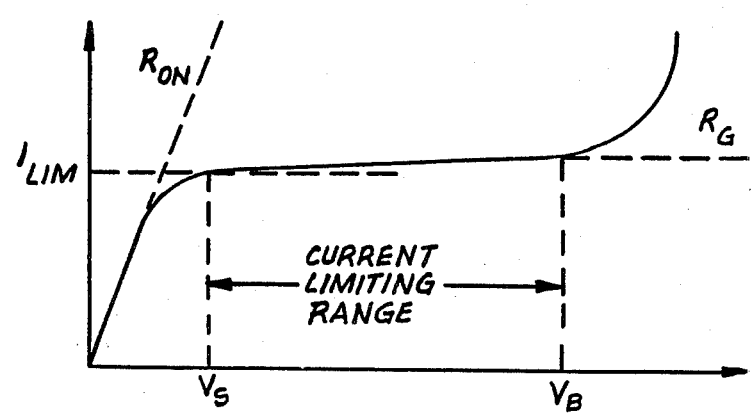
FIG. 2 is a graph of the electrical characteristics of such a limiter.

In FIG. 1a the region identified as 10 is the width of n-type layer as shown from above spaced between the n+ regions 20 and 30. Region 50 as shown in FIG. 1b is the thickness of the n-type layer in the n-channel structure described. FIG. 1b also shows regions 20 and 30 spaced on either side of the channel region 40. Contacts 60 and 62 in both FIGS. 1a and 1b provide input output for the structure. This structure has the characteristics as described in FIG. 2 where the limiting current remains essentially constant between certain saturation subvoltage $V_S$ to a breakdown voltage $V_B$. Two other parameters of interest are the ohmic on resistance $R_{ON}$ and the saturation resistance $R_G$ as shown in FIG. 2. A current limiter made of GaAs material; for example, is based on the well known high-field electron-drift-velocity saturation, which occurs at a critical electric field $E_c = 3 \times 10^3$ volt/cm. A device to produce the current-limiting function is then merely a N+-N-N+ structure of specified cross-section, which determines the limiting current through the relation $$I_{LIM} = I_s + I_G \qquad 1.0$$

In Eq. (1.0), $I_s$ is the velocity-limited saturation current component $$I_s = qN_D v_s aW \qquad 1.1$$

and $I_G$ is a space-charge injected current component equal to $$I_G = \frac{2ee_o v_s aW}{L^2} V \qquad 1.2$$

where
q = is the electron charge
$N_D$ = is the average doner concentration
$v_s$ = is the saturated drift velocity
a = is the thickness of n-type layer
W = is the width of n-type layer
$ee_o$ = is the dielectric constant
L = is the length of the n-type layer
V = is the applied voltage FIGS. 1a and 1b show the basic geometry of the GaAs channel current-limiter and FIG. 2 presents a voltage-current characteristic of the element and the important current-limiter parameters. The ohmic on-resistance is simply $$R_{ON} = \frac{L}{qN_D \mu aW} \qquad 2.0$$

and the resistance in the saturation region is given by $$R_G = \frac{L^2}{2ee_o v_s aW} \qquad 2.1$$

As a typical design example we select:

$N_D = 10^{17}$ cm$^{-3}$ $a = 0.3 \times 10^{-4}$ cm $W = 25 \times 10^{-4}$ cm $L = 5 \times 10^{-4}$ cm $\mu = 3000$ cm$^2$/vsec so that from the given equations:

$R_{ON} = 130$ ohm $R_G = 160$K ohms $I_{LIM} = 12$ mA $V_s = 1.5$ volt

The saturation voltage, $V_s$, is in a first order approximation given by the product $E_c L$ and equals 1.5 volts for the design example. In the current limiting range, space-charge injected current, $I_G$, degrades the limiter characteristics by contributing a space-charge-limited voltage-dependent current. This result was derived from Poisson's equation by assuming that the charge carriers move with constant velocity $v_s$.

The voltage above which current-limiting ceases, $V_B$, depends upon the breakdown voltage in the material and is related to impact ionization in the conduction path. Experimental current-limiters were fabricated in the laboratory with epitaxial material of doping level $N_D = 5 \times 10^{16}$ cm$^{-3}$.

The effective shunting capacitance, $C_s$, of this element is kept small by keeping the contact areas 60 and 62 small and of course having the advantage of being fabricated on semi-insulating substrates of GaAs. A useful figure of merit in this regard is $I_{LIM}/C_s$, the time rate of voltage change when the current is interrupted. A time delay, $\tau = L/v_s$, is associated with electron-drift velocity saturation and amounts to $5 \times 10^{-11}$ sec or 50 psec for a structure with $L = 5 \times 10^{-4}$ cm. This very short response time is an important feature of this current-limiter. Because $\tau$ is so small, $C_s$ is the major speed-limiting factor.

It is clear that tight control of dopant concentration ($N_D$) and channel height (a) is required over large wafer area's in order to achieve good uniformity of electrical device characteristics as well as reasonable yields in integrated circuit fabrication. Although changes of $N_d$ and a of less than ten percent over small wafer areas can be obtained with the standard techniques of diffusion and epitaxy previously described, it is not the yield of devices and circuits per wafer, but rather the yield of good wafers which renders the standard technology marginal in getting good overall yields in integrated circuit fabrication. Implantation selenium and silicon ions in GaAs devices on the otherhand indicates a drain saturation current variation of only ten percent over large wafer areas. This amounts to the control of $N_D$ and a within a two percent variation in large scale integration (LSI). Thus ion implantation allows for an optimized enhancement within the necessary tolerances to ensure device uniformity and thus provides better yields in integrated circuit fabrication than standard technology of diffusion and epitaxy. Uniformity of performance characteristics for ion implantation devices depends primarily on the results of the capping and annealing procedures and secondarily on the ohmic contact and series resistance control obtainable with the presently used fabrication technologies.

As stated above when compared with epitaxy or diffusion, ion implanation has the advantage of allowing a precise control of impurity depth, concentration, and profile.

Figure 3:
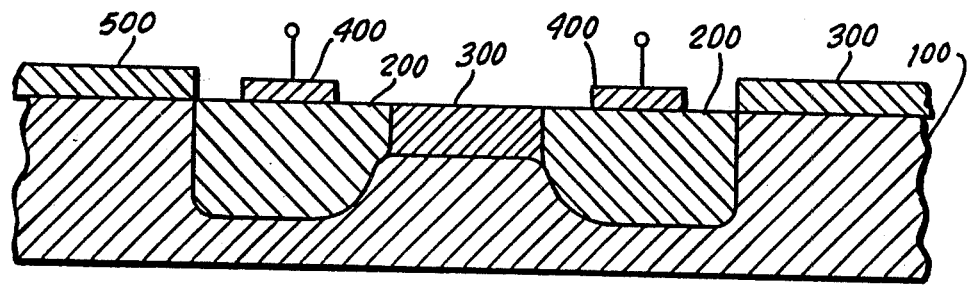
FIG. 3 is a cross-sectional view of a planar GaAs current limiter.

FIG. 1a shows a top view of the current limiter just described and FIG. 3 shows a cross-sectional view of said limiter as formed by ion implantation. As may be noted FIG. 3 shows a semi-insulating Gallium Arsenide layer 100 having ion implanted n+ regions 200 implarted therein and an intermediate ion implanted n region 300, smaller in depth than the n+ region. Both ohmic contacts 400 are disposed over the n+ region thus completing the basic current limiter structure. Current limiter is otherwise insulated from the adjacent structure by a layer of silicon dioxide 500 used in the fabrication of the device itself.

Figure 4A:
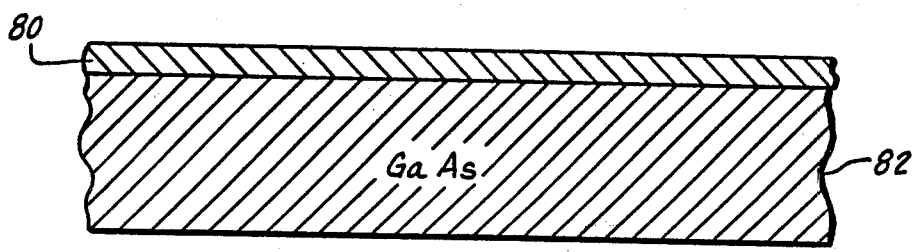
FIG. 4a through 4c is a cross-sectional view of the planar current limiter at selected steps of the fabrication.
Figure 4B:
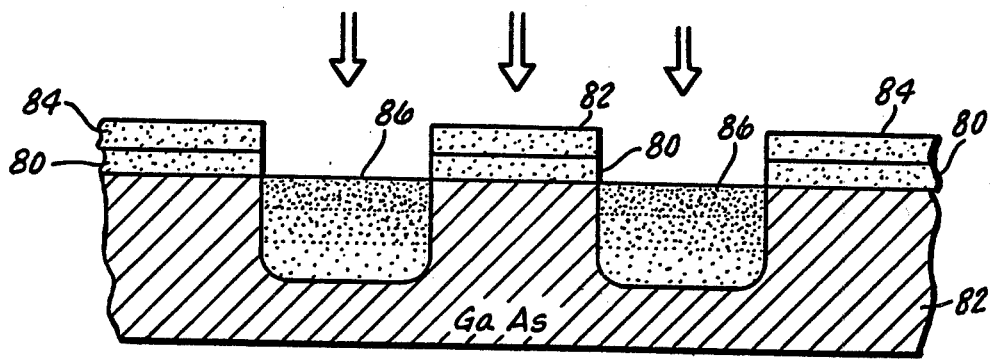
Figure 4C:
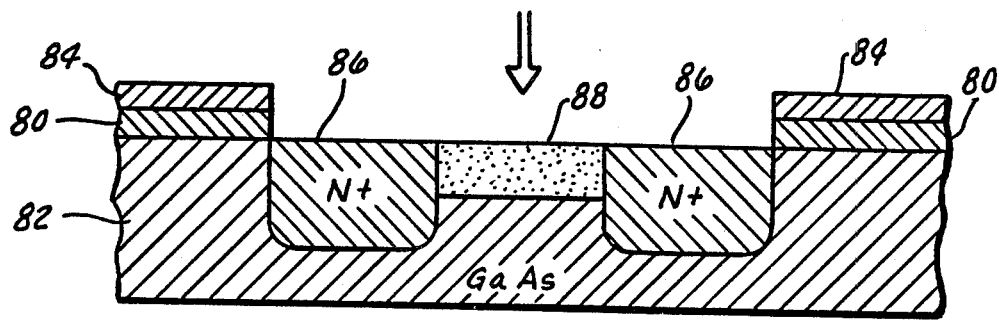

Initially as shown in FIG. 4a through 4c the process involves deposition of a layer of silicon dioxide 80 on top of a layer of semi-insulating Gallium Arsenide substrate 82. Silicon dioxide 80 is selectively covered with a photoresist mask 84 which opens the n+ regions for the current limiter and the exposed silicon dioxide 80 is etched away to the surface of the Gallium Arsenide substrate as shown in FIG. 4b. The n+ regions 86 are formed by Selinium (Se+) ion implantation initially at 190 KEV at $1 \times 10^{13}$ ions/cm$^2$ at a temperature of 300 degrees centigrade. Another ion implant at 100 KEV at $2 \times 10^{13}$ ions/cm$^2$ at 300 degrees centigrade. A third ion implantation at 50 KEV at $5 \times 10^{13}$ ions/cm$^2$ at 300 degrees centigrade is made, thus, gradually increasing dopant concentration as one proceeds toward the surface. At this point the photoresist mask and the silicon dioxide between the n+ regions are stripped away and a final implant is made thereby creating an n region 88 between the two n+ regions at a shallow depth, thereby transforming the process from one of lateral control of the prior art mesa structure to the vertical control by the timing of the ion implantation process as shown in FIG. 4c. Accordingly, very reliable repeatable Gallium Arsenide substrate structures may be created through the use of selective ion implantation for fabrication of planar devices. It is important to note at this point that the distribution of activated atoms produced by ion implantation forms a gaussian distribution as a function of both depth and concentration. Upon annealing, however, the distribution tends to merge with a high conductivity area skewed toward the surface of the device even though a triple implant was made.

From the foregoing it can be seen that the same application from the current limiting device can be applied to the JFET inverter and each made by selected ion implantation as described hereafter. A GaAs JFET inverter made by selective ion implantation may be made by the following process as shown in FIG. 5a through 5e.

Figure 5A:
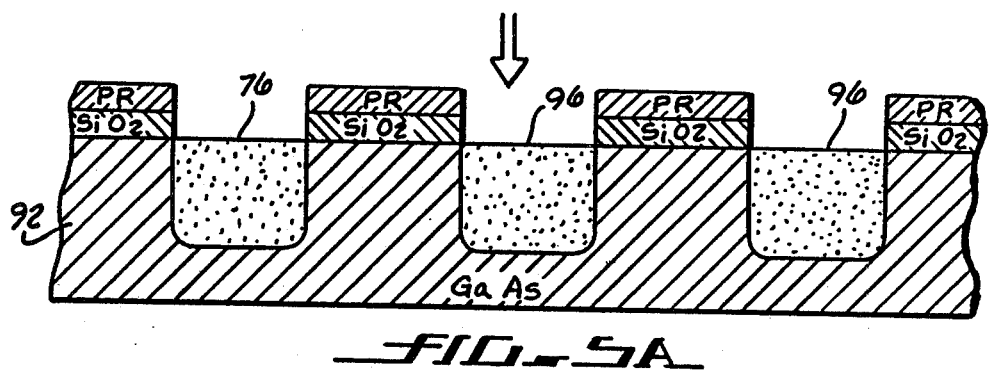
Figure 5B:
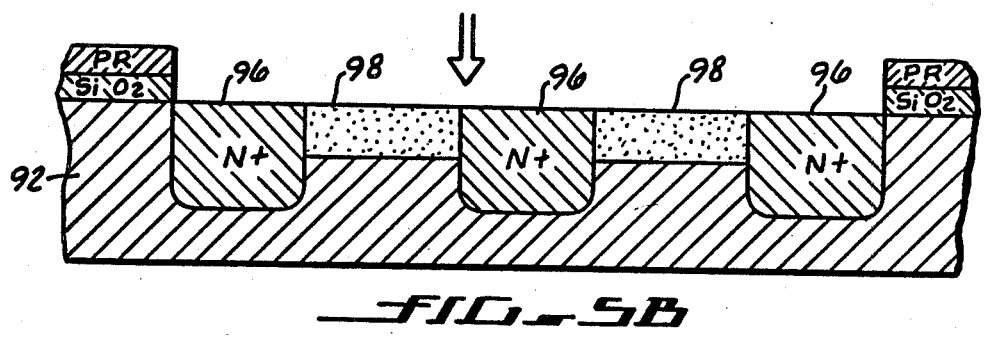
Figure 5C:
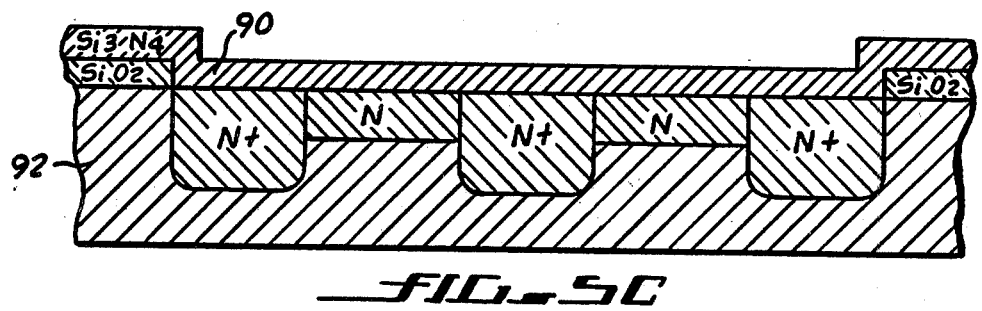
Figure 5D:
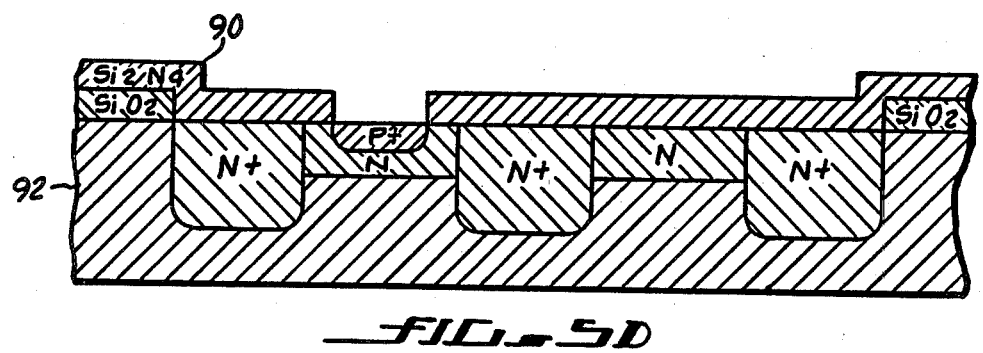

First n+ contact areas 96 are implanted as before and as shown in FIG. 5a into high resistivity chromium compensated or buffer layered Gallium Arsenide substrate 92 material using selenium (Se+) at three different energies and doses. Namely, 190 KEV with $1.3 \times 10^{14}$ atoms/cm$^2$, 100 KEV with $2.6 \times 10^{14}$ atoms/cm$^2$, and 50 KEV with $6.5 \times 10^{14}$ atoms/cm$^2$. After opening up the channel region another Se+ implant is made at 200 KEV with a dose of $2 \times 10^{14}$ to $4 \times 10^{14}$ atoms/cm$^2$ at 300 degrees centigrade substrate temperature as shown in FIG. 5b. Lower temperatures such as 250° C. result in less activation in the substrate because of damage to the lattice on entry of the ions while higher temperatures approach the decomposition temperature of GaAs at 450° C. For the instant invention optimum device characteristics are achieved at an implant temperature of approximately 300° C. Capping material 90 Si$_3$N$_4$ is sputtered on the surface, FIG. 5c, and the ion implant is annealed in hydrogen at a temperature of between 750 to 925 degrees centigrade for 20 minutes. The activated impurity profile is obtained by differential Hall measurements as shown in FIG. 6 which represents typical profiles from the n channel and the ohmic contact n+ region. The p+ gate layer 91 is prepared by zinc (Zn) diffusion or alternatively by ion implantation using the nitride 90 as a mask as shown in FIG. 5d. In order to fabricate enhancement mode devices with threshold voltage of 0.1 to 0.2 volts the built-in voltage of the diffused junction must slightly exceed the electrostatic potential $V_p$ across the fully depleted channel this is accomplished by adjusting the depth of Zn so that about $2 \times 10^{12}$ atoms/cm$^2$ from the implanated impurity dose are left active in the channel. The 650 degree centigrade open tube diffusion is controllable by timing to give junction depths in the range of 500 to 2,000 angstroms within plus or minus ten percent. For diffusion of Zn at 625 degrees centigrade, diffusion constant $D=2 \times 10^{-13}$ cm$^2$/sec. was determined from the junction depth of an n type background doping of $1 \times 10^{17}$ atoms/cm$^2$. Zinc diffusion however, is usually accompanied by lateral spreading effect which limits the minimal gate length achievable by diffusion. Therefore the Zn diffusion may be replaced by ion implanatation of a p type dopant, which is generally stationary at the annealing temperature in 1 $\mu$m channel length devices. Lateral junction definition of less than 1 $\mu$m can be realized with the use of electron beam photography in combination with ion implantation. In FIG. 5e ohmic contacts 93 are made with AuGe eutectic alloy 95 and a gold (Au) 97 overlay, the later being also used for circuit interconnection.

The ion implantation just described allows planar construction of GaAs JFET inverter by selective ion implantation and eliminates the steps and plateaus which the gold/germanium alloy contacts would otherwise be required to traverse and thus eliminates regions responsible for defective device fabrication in compound semiconductor devices.

It is further clear from the foregoing that a plurality of combinations of various GaAs devices can be fabricated following the above process including quasi-complementary type structures as well as replacing the resistive structure with an active load E-JFET as is commonly used in the art.

Although the structure for GaAs enhancement mode J-FET is shown in FIG. 5, J-FETS are very much degraded by the series resistance between the source and gate region. This resistance, $R_S$, reduces the optimum source drain saturation current $I_{DS}$, so that a lower value $I_{DS}$, results according to the relation $$I_{DS}' = \frac{I_{DS}}{1 + 2R_sK(V_G - V_T)} \qquad 3.0$$

(where k is a constant for each device geometry and $V_G$ and $V_T$ the applied gate and threshold voltages respectively). If a new structure, as shown in FIG. 7, is used with the reduction of the source/gate spacing 110 to zero then a reduction of the detrimental series resistance is experienced which does not interfere with normal device operation. It maintains ohmic contact arrangement while permiting the highest degree of gate length control during processing as described above and presents the least amount of registration difficulties. By shifting the gate towards the source one can obtain structures with very small values of $R_S$. Ion implantation allows small channel lengths as well as preventing large lateral doping which occurs in diffusion type systems. Thus, mask alignment is not as difficult as in prior systems.

It should be noted that the reduction of the source gate spacing 101 as shown in FIG. 7 to zero in the improved structure is possible due to the face that the enhancement mode FET gate is forward biased and no reverse breakdown voltage requirement is imposed. For heavy and degenerate doping a "tunnel diode" characteristic will be present with negative resistance properties. However no oscillation occurs because of the unilateral gain characteristics of the device, and the negative resistance properties are not detrimental to device operation since the output is decoupled from the input and no feedback is present. Thus, stability is maintained in spite of the negative resistance characteristics. It is possible then to generate negative resistance, voltage current characteristics, in the outputs when such tunnel diode exists between the gate and drain terminal by reversing the source and the drain. The IV characteristics are then amplified by the transconductance of the active field effect transistor.

From the foregoing discussion of ion implantation in Gallium Arsenide type structures, it may be noted that multiple energy and dosage concentrations may be used to create various device profiles, by selectively implanting ions in varying concentrations at varying depths. Accordingly, the basic structure as shown in FIG. 7 previously described can be further modified as shown in FIG. 8 to remove lateral control difficulties of small spacing in the micron range by photo or electron beam photograph to vertical control of submicron separation by the highly controllable ion implantation process, and thereby form a gate region having an upper p+ region 102 sharing a common boundary with the n+ source region 104 but which has an extremely small n channel region 106. This structure further includes a portion 52 of the channel 106 which reaches the surface of device on one side of the p+ region 102 but is disposed somewhat over the n+ drain region 108. This preserves the reduction of series resistance between the source and the gate to virtually zero while at the same time providing some isolation from the drain and thereby establishes the breakdown voltages of the device. The speed of operation in such devices is essentially determined by the channel length region 56 as shown in FIG. 7. With ion implantation however first n+ regions may be implanted in a depth greater than the depth of the channel region as shown in FIG. 8 and the region 60 masked and further implantation in the n+ region as previously described in order to establish the dopant profiles as indicated before. Since in this case mask 60 will cover a portion of the n+ region the dopant profile will be different in a portion of a region which underlies the n channel region and thus allows a portion of the n channel to reach the surface of the device and subsequent implantation or diffusion of a p+ region in the channel will be still be isolated from the drain. It may be noted however that the minimum dimension channel dimensions, that is, the distance the electrons must travel from the n+ source region to the n+ drain region has been maintained while the voltage breakdown region 52 has been converted to vertical control of the voltage breakdown in region 58. Hence the device in FIG. 8 will operate in the same manner as the device in FIG. 7 however higher switching speeds may be obtained due to the shorter channel length. The device of FIG. 8 can be biased in only one direction and therefore constitutes an asymmetrical electrical device. In FIG. 8 region 58 is on order of magnitude smaller than the region 52. While the region 56 approaches one micrometer, region 52, for example, may be approximately twenty thousand angstroms in length while region 58 is approximately a thousand angstroms in depth. This structure exhibits the shortest transit time of carriers in the channel over the distance 56 and therefore offers the ultimate switching speed capability. A further modification of the geometry of FIG. 8 provides isolation of the gate region by portions 52 of the channel 106 on both sides of the p+ region 102 as shown in FIG. 9. Complete symmetry is thereby provided so that the device may be used in either direction but in this case some series resistance is introduced while maintaining the short channel region 56. This structure still retains the vertical submicron dimension control through ion implantation and achieves ultimate switching speed performance and also allows for either depletion or enhancement mode device operation depending on applied bias. The selective ion implantation techniques allow for controlled structure configuration for preselected electrical characteristics. All of the foregoing is equally applicable to p channel structures although n channel is preferred.

What is claimed is:

1. A process for fabricating a planar III-V compound semiconductor device comprising:
   a. forming a first mask on a surface of the semiconductor material to expose selected first areas of the material;
   b. implanting first ions selected from the group consisting of selenium and other N-type donor ions into the first areas by ion implantation at sufficient accelerating energies and concentrations to form N+ regions in the GaAs material beneath the first areas wherein the implantation comprises at least two separate implantations such that the resulting concentration of the first ions in the material decreases with increasing depth beneath the surface of the material;
   c. removing a portion of the first mask to expose the surface of the material between at least two adjacent implanted first areas;
   d. implanting further first ions in the exposed channel region of step (c) and in the first areas such that the resulting ion concentration in the channel region is lower than the ion concentration in the adjacent first areas and at a shallower depth than the implanted ion regions in the adjacent first areas, such that the temperature of the semiconductor material during the ion implantation steps (b) and (d) is held at a temperature of approximately 300° C.;
   e. annealing the material; and
   f. forming suitable electrical contacts on at least a portion of at least two adjacent first areas now connected by the implanted channel region.

2. The process of claim 1 further comprising:
   a. after the annealing step but before the electrical contact formation step, forming a second mask over the material such that a portion of at least the channel region is exposed in at least one area;
   b. introducing second ions selected from the group consisting of zinc and other p-type acceptor ions into the portions exposed by the second mask to a predetermined depth in the material such that at least one gate region is formed in the material; and
   c. forming an electrical contact to the at least one gate region.

3. The process of claim 2 wherein the step whereby second ions are introduced is an ion implantation step.

4. The process of claim 3 wherein the step whereby second ions are introduced is a diffusion step.

5. The process of claim 1 wherein the III-V compound comprises Ga and As.

6. The process of claim 2 wherein the III-V compound comprises Ga and As.

* * * * *